United States Patent
Manley et al.

(10) Patent No.: US 12,520,581 B2
(45) Date of Patent: Jan. 6, 2026

(54) FABRICATION OF HIGH MOBILITY THIN FILM TRANSISTORS ON THIN AND FLEXIBLE CERAMIC SUBSTRATE

(71) Applicant: CORNING INCORPORATED, Corning, NY (US)

(72) Inventors: Robert George Manley, Ocala, FL (US); Nikolay Zhelev Zhelev, Evanston, IL (US); Bin Zhu, Ithaca, NY (US)

(73) Assignee: CORNING INCORPORATED, Corning, NY (US)

( * ) Notice: Subject to any disclaimer, the term of this patent is extended or adjusted under 35 U.S.C. 154(b) by 665 days.

(21) Appl. No.: 17/990,797

(22) Filed: Nov. 21, 2022

(65) Prior Publication Data

US 2023/0163144 A1    May 25, 2023

Related U.S. Application Data (60) Provisional application No. 63/282,746, filed on Nov. 24, 2021.

(51) Int. Cl.
| | |
|---|---|
| *H10D 86/01* | (2025.01) |
| *H10D 30/01* | (2025.01) |
| *H10D 30/67* | (2025.01) |
| *H10D 86/40* | (2025.01) |
| *H10D 86/60* | (2025.01) |

(52) U.S. Cl.
CPC ..... *H10D 86/0223* (2025.01); *H10D 30/0314* (2025.01); *H10D 30/0321* (2025.01); *H10D 30/6715* (2025.01); *H10D 30/6731* (2025.01); *H10D 30/6745* (2025.01); *H10D 86/411* (2025.01); *H10D 86/421* (2025.01); *H10D 86/441* (2025.01); *H10D 86/60* (2025.01)

(58) Field of Classification Search
CPC .......... H10D 86/0223; H10D 30/0314; H10D 30/0321; H10D 30/6715; H10D 30/6731; H10D 30/6745; H10D 86/411; H10D 86/421; H10D 86/60; H10D 30/6713
See application file for complete search history.

(56) References Cited

U.S. PATENT DOCUMENTS

| | | |
|---|---|---|
| 7,176,528 B2 | 2/2007 | Couillard et al. |
| 7,563,659 B2 | 7/2009 | Kwon et al. |
| 9,437,417 B2 | 9/2016 | Tian et al. |
| 10,581,115 B2 | 3/2020 | Badding et al. |
| 2007/0155067 A1 | 7/2007 | Park et al. |

(Continued)

OTHER PUBLICATIONS

Nakamura et al., "Silicon on sapphire (SOS) device technology", Oki Technical Review, vol. 71, No. 4, 2004, 66.

(Continued)

*Primary Examiner* — Wasiul Haider (57) ABSTRACT

A method for making a thin film transistor device includes forming a semiconductor film on a flexible substrate comprising a thin ribbon of refractory material that does not degrade when heated to temperatures greater than about 750° C. The semiconductor film is crystallized by heating the semiconductor film and the flexible substrate to at least about 750° C. A dielectric material is deposited on the crystallized semiconductor film. Gate, source, and drain electrodes are formed on the dielectric material.

20 Claims, 7 Drawing Sheets

(56) References Cited

U.S. PATENT DOCUMENTS

2013/0069053 A1\* 3/2013 Yamazaki .............. H10D 86/60
257/43
2020/0251335 A1 8/2020 Hirschman et al.

OTHER PUBLICATIONS

Olson et al., "Kinetics of solid phase crystallization in amorphous silicon", Materials Science Reports, vol. 3, No. 1, 1988, 1.
Watanabe et al., "Crystallization process of polycrystalline silicon by KrF eximer laser annealing", Japanese Journal of Applied Physics, vol. 33, No. 1, 1998, 4491.
Zhuang et al., "Flexibility matters: High purity, thin, flexible alumina ribbon ceramic", Ceramic & Glass Manufacturing, vol. 1, No. 4, 2020, 10.

\* cited by examiner

FABRICATION OF HIGH MOBILITY THIN FILM TRANSISTORS ON THIN AND FLEXIBLE CERAMIC SUBSTRATE

CROSS-REFERENCE TO RELATED APPLICATIONS

This application claims the benefit of priority under 35 U.S.C. § 119 of U.S. Provisional Application No. 63/282,746 filed Nov. 24, 2021, the content of which is incorporated herein by reference in its entirety.

BACKGROUND

Various types of semiconductor devices have been developed. For example, thin film transistors may be utilized in display backplanes, sensor arrays, switching circuits for RF electronics, sensors, and various other technologies. Thin film transistors typically include conductive source drain pads connected with a semiconductor film or layer that is separated from a conductive gate by a dielectric film or layer. The semiconductor film may be characterized by its charge mobility.

Silicon is a known semiconductor film, and it may be deposited on insulator substrates using chemical vapor deposition, typically utilizing plasma-enhanced chemical vapor deposition (PECVD). The PECVD process produces amorphous silicon (a-Si), which has low electron mobility (e.g., less than 1 $cm^2 \cdot V^{-1} \cdot s^{-1}$), which is on the order of 1,000 times less than that of crystalline silicon. In order to increase mobility, a-Si may be crystallized into a polycrystalline film. Excimer laser annealing (ELA) is a known method for forming polycrystalline films on low strain point glasses. In ELA, a significant portion of the energy may be absorbed by the silicon rather than the substrate. The ELA process may alleviate thermal constraints associated with the substrate material, which permits the use of substrates with maximum allowable temperatures of less than 750° C. (e.g., display glass).

SUMMARY

An aspect of the present disclosure is a thin film transistor device that is fabricated utilizing a refractory substrate having an elevated temperature capability. A silicon film may be deposited on the substrate, and the whole substrate along with the silicon film may be heated to temperatures above about 750° C., thereby converting amorphous silicon into uniform, high-mobility polycrystalline silicon through the process of solid-phase crystallization. The substrate may comprise a ribbon ceramic substrate that does not degrade at higher temperatures (e.g., greater than about 750° C.), while providing desirable dielectric properties (e.g., a high dielectric constant), extremely low substrate thickness, and also providing the ability to process the substrate in a roll-to-roll process.

Another aspect of the present disclosure is a method of making a thin film transistor device. The method includes forming a semiconductor film (layer) on a thin flexible substrate. The flexible substrate preferably comprises a thin ribbon of refractory material (e.g., ceramic) that does not degrade when heated to temperatures greater than at least about 750° C. The semiconductor film is crystallized (annealed) by simultaneously heating the semiconductor film and the flexible substrate to at least about 750° C. in a kiln, oven, furnace, or other suitable apparatus. Annealing may be accomplished utilizing a convective heating process. A gate insulator dielectric is formed on the crystallized semiconductor film, and a gate electrode is formed on the gate insulator dielectric. Source and drain electrodes are formed such that the source and drain electrodes are in electrical contact with the crystallized semiconductor film. The electrical contact may comprise Ohmic contact or, alternatively, Schottky contact, as required for a particular device. The method may optionally include forming the source and/or drain electrodes on the crystallized semiconductor film whereby the source and drain electrodes are in electrically conductive contact with the crystallized semiconductor film.

The crystallized semiconductor film may have an electron mobility of at least about 10 $cm^2 \cdot V^{-1} \cdot s^{-1}$, and the semiconductor film may comprise silicon that is amorphous prior to crystallization. The semiconductor film is optionally deposited on the flexible substrate utilizing plasma-enhanced chemical vapor deposition.

A plurality of the thin film transistor devices may optionally be formed on an elongated continuous substrate that extends through at least one process station, wherein the at least one process station is selected from the group consisting of a plasma-enhanced chemical vapor deposition station; a heating (annealing) station comprising at least one of a kiln, an oven, or a furnace; a station for forming the gate insulator dielectric on the crystallized semiconductor film, and a station that forms at least one of the gate electrode, the source electrode, and the drain electrode.

The elongated continuous substrate may optionally include opposite end portions, and the method may optionally include forming rolls including the opposite end portions. The elongated continuous substrate may be moved through at least one station in a roll-to-roll process that includes forming spaced apart first and second rolls using the opposite end portions.

The refractory material of the flexible substrate is optionally selected from the group consisting of flexible alumina ceramic and flexible yttrium-stabilized zirconia.

The flexible substrate optionally has a thickness of about 5 µm to about 100 µm, and the flexible substrate may optionally have a thickness of about 20 µm.

The flexible substrate optionally has a width of about 200 mm to about 400 mm when the semiconductor film is formed on the flexible substrate.

The process optionally includes forming through substrate conductive vias that extend through the flexible substrate, or vias that extend through a passivating insulating layer that extends over at least one of the gate electrode, the source electrode, and the drain electrode.

Optionally, at least one of the source electrode and the gate electrode are in Schottky or Ohmic contact with the crystallized semiconductor film.

The method optionally includes doping the crystallized semiconductor material to form source, drain, and channel regions. The source, drain, and channel electrodes may be formed adjacent the source, drain, and channel regions, respectively. The method optionally includes forming a pair of gate electrodes adjacent to the channel region.

The semiconductor film optionally comprises a material selected from the group consisting of Ge, SiGe, CdTe, CIGS, Epitaxial GaAs, GaN, and silicon.

The method optionally includes patterning the semiconductor film to form a plurality of electrically isolated regions (islands) of semiconductor film disposed on the flexible substrate, whereby a plurality of thin film transistor devices can be formed on a single piece of the flexible substrate.

The method optionally includes depositing a first layer of material on the flexible substrate before forming the semiconductor film on the substrate, wherein the first layer comprises a material selected from the group consisting of smoothening materials having reduced surface roughness relative to a surface roughness of the flexible substrate, barrier materials that prevent migration of molecules from the flexible substrate into the semiconductor film, and materials that provide a barrier and reduced surface roughness.

Another aspect of the present disclosure is a method for making a display panel comprising a plurality of thin film transistor devices. The method includes forming a semiconductor film on a flexible substrate, wherein the flexible substrate comprises a thin ribbon of refractory material. The semiconductor film is patterned to form a plurality of discrete islands of the semiconductor film that are disposed on the flexible substrate. The islands are preferably electrically separated from one another by gaps that may be filled with a dielectric material. The method further includes crystallizing the semiconductor film by convectively heating the semiconductor film and the flexible substrate. The semiconductor film is doped after crystallization. The method further includes forming a gate insulator dielectric on the crystallized semiconductor film of each discrete island. A gate electrode is formed on the gate insulator dielectric of each discrete island. A source electrode is formed, wherein the source electrode is electrically connected to the crystallized semiconductor film of each discrete island. The method further includes forming a drain electrode that is electrically connected to the crystallized semiconductor film of each discrete island. The method further includes operably connecting the thin film transistor devices to form a plurality of sub-pixels. The crystallized semiconductor film may, optionally, have an electron mobility of at least about 10 $cm^2 \cdot V^{-1} \cdot s^{-1}$.

A plurality of the thin film transistor devices may, optionally, be formed on an elongated continuous substrate that extends through at least one station, wherein the at least one station is selected from the group consisting of a plasma-enhanced chemical vapor deposition station, a convective heating station, a station for forming the gate insulator dielectric on the crystallized semiconductor film, and a station that forms at least one of the gate electrode, the source electrode, and the drain electrode.

Another aspect of the present disclosure is a method for making a thin film transistor device. The method includes forming a semiconductor film on a flexible substrate, wherein the flexible substrate comprises a thin ribbon of refractory material. The method further includes depositing a smoothening film onto the flexible substrate to provide reduced surface roughness. The semiconductor film is crystallized by convectively heating the semiconductor film and the flexible substrate to at least about 750° C. in a kiln, oven, or furnace. The method further includes forming a gate insulator dielectric on the crystallized semiconductor film, forming a gate electrode on the gate insulator dielectric, and forming a source electrode that is electrically connected to the crystallized semiconductor film. The method further includes forming a drain electrode that is electrically connected to the crystallized semiconductor film. The crystallized semiconductor film optionally comprises silicon having a mobility of at least about 10 $cm^2 \cdot V^{-1} \cdot s^{-1}$.

A plurality of the thin film transistor devices are optionally formed on an elongated continuous substrate in a roll-to-roll process.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiments, and together with the description serve to explain principles and operation of the various embodiments.

DETAILED DESCRIPTION

Reference will now be made in detail to the present preferred embodiments, examples of which are illustrated in the accompanying drawings. Whenever possible, the same reference numerals will be used throughout the drawings to refer to the same or like parts.

Figure 1:
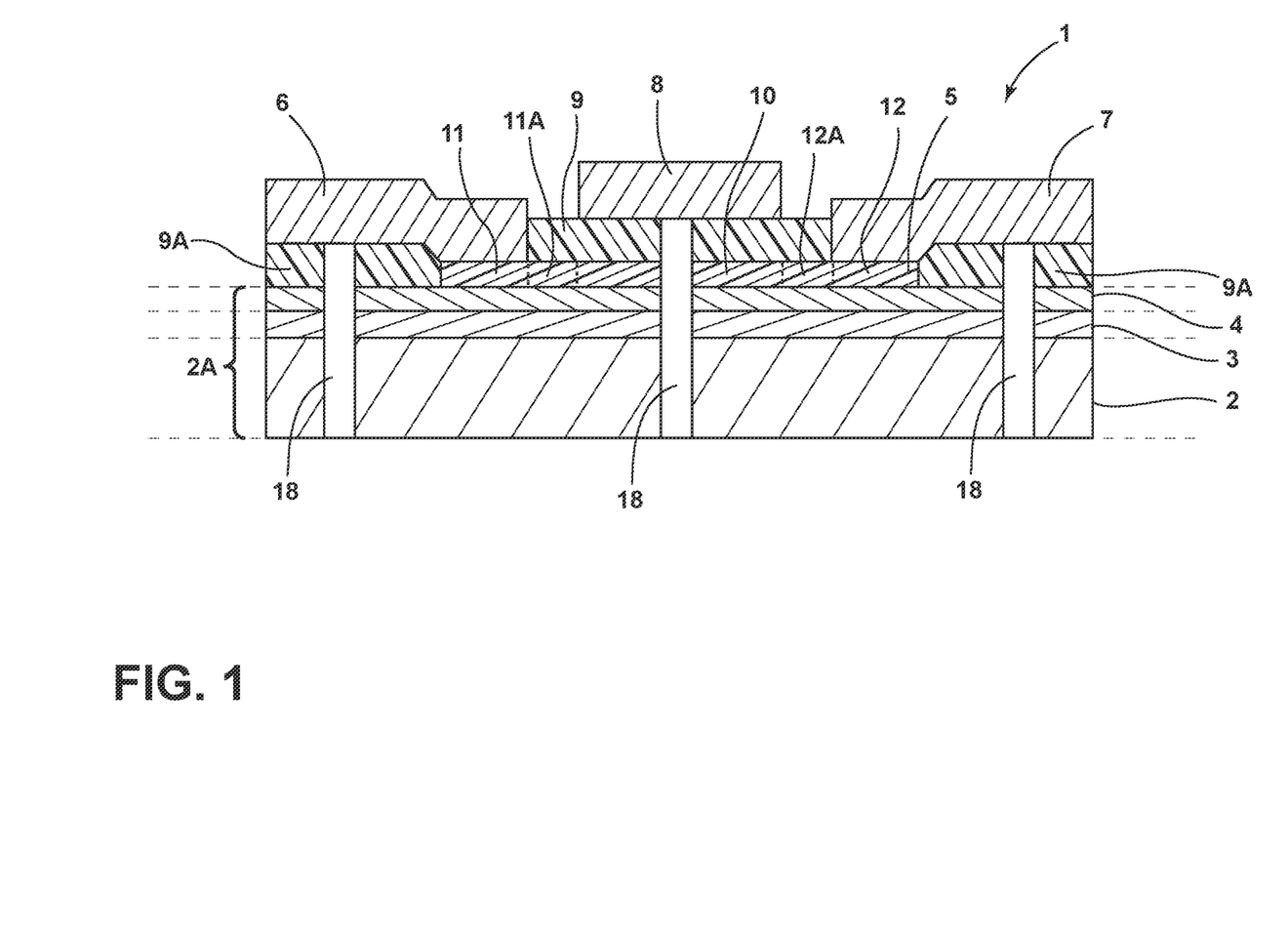
FIG. 1 is a cross-sectional schematic view of a thin film semiconductor device fabricated on a ribbon ceramic substrate according to an aspect of the present disclosure.

With reference to FIG. 1, a thin film transistor device 1 according to an aspect of the present disclosure includes a substrate 2A which may comprise a ceramic substrate material 2, an optional surface smoothing layer 3, and/or an optional diffusion barrier layer 4. As discussed in more detail below, the ceramic substrate material 2 may initially be in the form of an elongated thin flexible ribbon ceramic material. For example, substrate 2 may comprise a Corning® Alumina Ribbon Ceramic, or a Corning® Zirconia Ribbon Ceramic. Substrate 2 may have a thickness of about 5 μm-100 μm, with a typical thickness of about 20 μm. Substrate 2 may have an initial width of about 200-400 μm, and may initially form a roll. It will be understood, however, that the present disclosure is not limited to these materials or dimensions.

Device 1 further includes a polycrystalline silicon semiconductor material 5, a source electrode 6, a drain electrode 7, and a gate electrode 8. Source electrode 6, drain electrode 7, and gate electrode 8 may comprise metal (e.g., copper, silver, etc.) or other electrically conductive material. An insulating dielectric layer 9 may be formed from an oxide material to electrically separate (isolate) the gate 8 from the source and drain electrodes 6 and 7, and the channel region 10 of silicon semiconductor material 5. Additional dielectric material 9A and 9B may be disposed between electrodes 6, 7, and substrate 2A. Dielectric material 9, 9A, and 9B may comprise $S_iN_x$, $S_iO_2$ (or both), or other suitable material. The silicon semiconductor material 5 may include highly doped regions 11 and 12 that are in electrical contact (Ohmic or Schottky contact) with source and drain electrodes 6 and 7. Silicon semiconductor material 5 may further include lightly doped drains (LLDs) 11A and 12A disposed adjacent channel region 10. Channel region 10 may also be lightly doped. The regions 11, 11A, 12, 12A of silicon material 5 outside of channel region 10 may be p-doped, and the channel region 10 may be n-doped. It will be understood that the arrangement just described comprises an NMOS metal oxide semiconductor field effect transistor (MOSFET). However, the n- and p-type doping may be reversed to form a PMOS MOSFET. It will be understood that the amount and type of doping of semiconductor material 5 in the regions 10, 11, 11A, 12, and 12A may vary depending on the requirements of a particular device.

Figure 2:
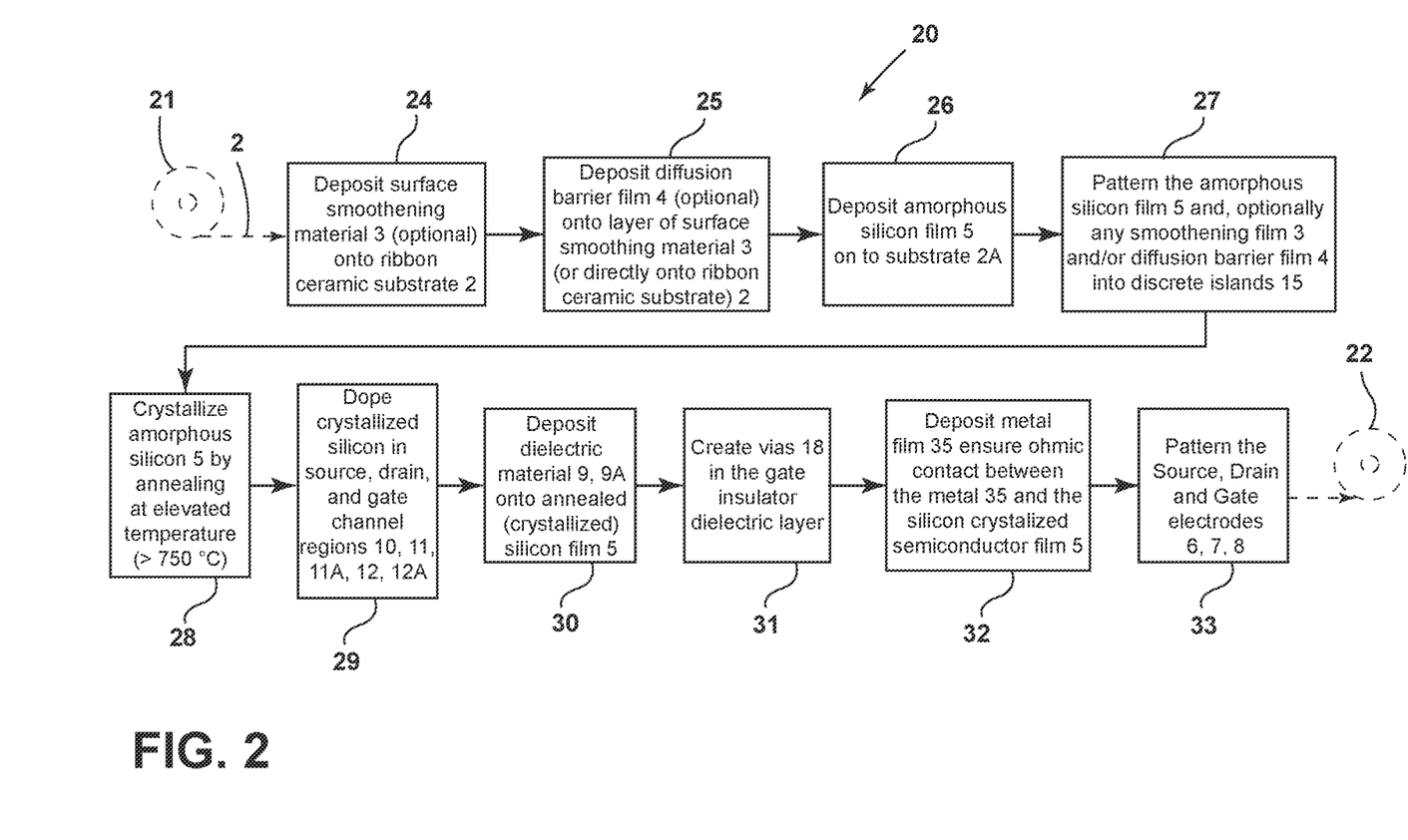
FIG. 2 is a flowchart showing a process for fabricating a thin film transistor on a ribbon ceramic substrate.

With further reference to FIG. 2, a process 24 of making device 1 generally includes steps 24-33. Steps 24-33 generally correspond to FIGS. 3-8. In FIG. 2, the steps 24-33 may generally correspond to stations utilized in the fabrication of device 1. As noted above, the ceramic substrate material 2 is initially in the form of a ribbon ceramic. The substrate material 2 may initially be in the form of a roll 21, and the ceramic substrate material 2 may be utilized in a roll-to-roll process, whereby a plurality of the completed devices 1 are interconnected by a carrier layer to form a roll 22. As noted above, the ribbon ceramic substrate 2 may comprise, but is not limited to, tape-cast thin and flexible alumina (e.g., Corning® Alumina Ribbon Ceramic) and yttrium-stabilized zirconia (e.g., Corning® Zirconia Ribbon Ceramic). As noted above, substrate 2 may have a thickness of about 5 μm-100 μm, with a typical thickness of about 20 μm. Substrate 2 may have an initial width of about 200-400 μm, and may initially form a roll.

Referring again to FIG. 2, in a first step 24 of process 20, an optional surface smoothening material 3 is deposited onto ribbon ceramic substrate 2 (see also FIG. 3) to provide a reduced surface roughness. Smoothening material 3 is optional and may not be required if the surface of substrate 2 is sufficiently smooth and/or if the materials deposited on substrate 2 do not require a high smoothness. In general, the smoothening material 3 may be deposited onto ceramic substrate 2 utilizing a spin-coating process utilizing commercially available Spin-On-Glass (SOG) products. It will be understood that SOG materials are generally known, and may consist of short-chain Si-based molecules dissolved in an organic solvent solution. The SOG materials may be deposited on the surface of ceramic substrate 2, and the solvent may then be evaporated. If the SOG material comprises Si—(OH)$_4$ molecules, a dense amorphous $Si_xO_y$ film can be formed due to a condensation reaction. Alternative formulations may incorporate phosphorus and boron, which result in either phospho-silicate glass (PSG) or boro-phospho-silicate glass (BPSG). Alternatively, the smoothening layer 3 may comprise a silica-based material (e.g., pure silica, or lightly doped silica) that forms amorphous coating on ceramic substrate material 2. The coating 3 may be deposited in a liquid state, such as through spin, spray, or slot die coating, and subsequently cured/annealed to form a dense glass network. Alternatively, the smoothening layer 3 may comprise a silica-based (either pure silica, or lightly doped) amorphous coating on ceramic substrate material 2. The coating 3 may be deposited in a liquid state, such as through spin, spray, or slot die coating, and subsequently cured/annealed to form a dense glass network. In general, the surface smoothening layer 3 may have an average surface roughness (Ra) of about 20-50 nm down to about 5 nm or less. This may be significantly less rough than the surface of substrate 2 prior to depositing smoothening layer 3. For example, substrate 2 may have a surface roughness of about 20-30 nm on one side, and a surface roughness of about 50-60 nm on the opposite side.

Figures 3, 4:
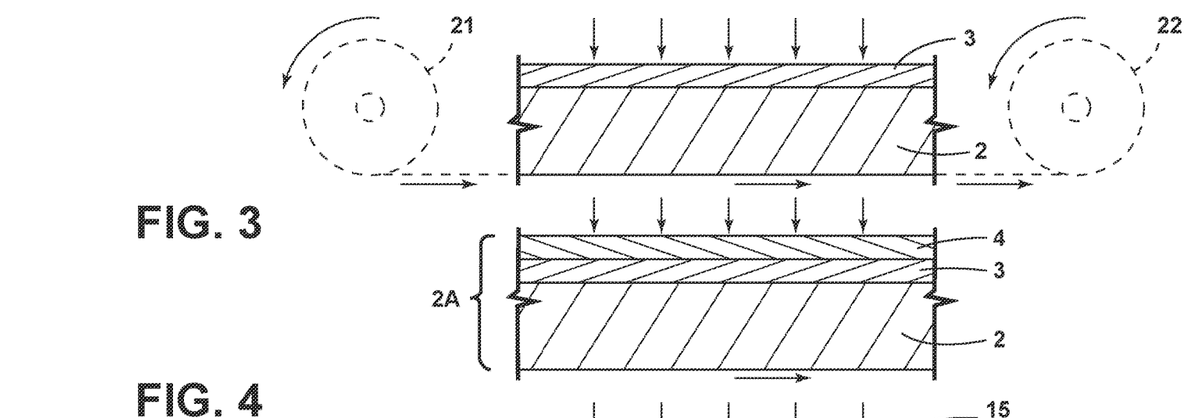
FIG. 3 is a fragmentary cross-sectional schematic view showing optional smoothening material being deposited onto a ribbon ceramic substrate.
FIG. 4 is a cross-sectional schematic view showing an optional diffusion barrier film being deposited onto a layer of surface smoothing material.

Referring again to FIG. 2, at step 25 a diffusion barrier layer or film 4 is optionally deposited onto the ceramic substrate material 2 or onto the smoothing layer 3 (see also FIG. 4). The diffusion barrier layer 4 may comprise a suitable material such as silicon nitride or silicon oxide (silicon dioxide, $S_iO_2$). It will be understood that other suitable materials may also be utilized. The diffusion barrier layer 4 is utilized (if necessary) to prevent diffusion of undesirable elements (molecules) from ceramic substrate material 2 and/or surface smoothing layer 3 into the silicon material 5. In general, the diffusion barrier layer 4 may be formed utilizing a suitable process such as plasma-enhanced chemical vapor deposition (PECVD). If the diffusion barrier layer 4 comprises silicon dioxide, the layer 4 may be deposited utilizing a chemical vapor deposition process, or a thermal oxidation process utilizing a high temperature furnace with an oxygen source (e.g., gas or vapor).

It will be understood, however, that the optional diffusion barrier film 4 may not be required in all cases, and the diffusion barrier layer 4 is not necessarily limited to the examples and corresponding processes described above. Rather, the diffusion barrier layer 4 may comprise virtually any suitable material that is deposited utilizing virtually any suitable process. Also, if smoothening layer 3 has sufficient barrier properties, the smoothening layer 3 may provide both smoothening and barrier functions, whereby a separate barrier layer 4 is not required.

Figure 5:
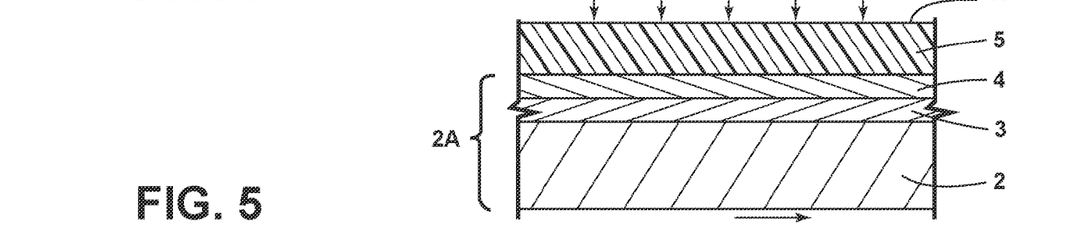
FIG. 5 is a cross-sectional schematic view showing amorphous silicon film being deposited onto the optional diffusion barrier film or the ribbon ceramic substrate.

Referring again to FIG. 2, at step 26 an amorphous silicon film 5 is formed on substrate 2A (substrate 2A may comprise one or more of ceramic substrate material 2, surface smoothing layer 3, and/or diffusion barrier layer 4) (see also FIG. 5). The amorphous silicon film or layer 5 may be deposited utilizing a suitable process such as plasma-enhanced chemical vapor deposition (PECVD). It will be understood that numerous suitable processes are known, and the present disclosure is not limited to a PECVD process. Also, although the semiconductor film or layer 5 is described as comprising silicon, the layer 5 may comprise other semiconductor materials such as Ge, SiGe, CdTe, CIGS, Epitaxial GaAs, GaN, etc., where the formation of semiconductor crystalline structures may benefit from high temperature (e.g., greater than about 750° C.) processing at extended times (e.g., greater than 1 µs) to form crystalline semiconductor materials.

Figure 6:
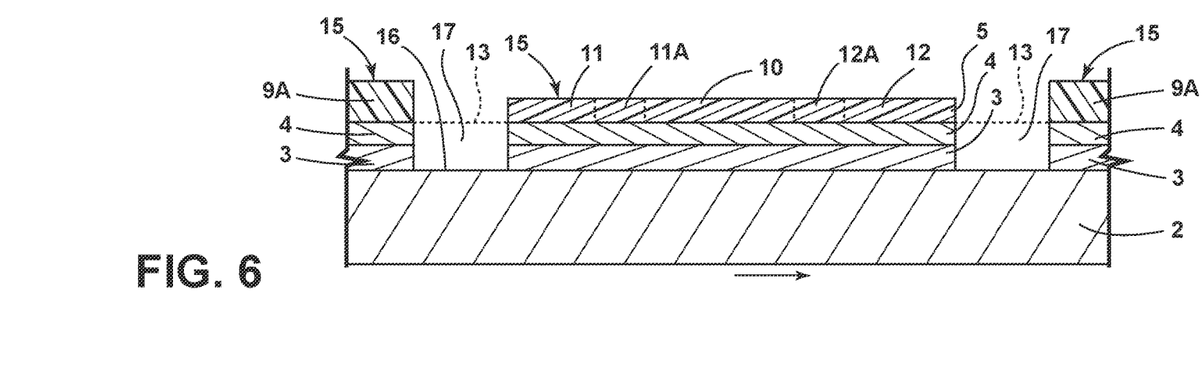
FIG. 6 is a cross-sectional schematic view showing patterning of the amorphous silicon film and any smoothening and/or diffusion barrier films into discrete islands.
Figure 7:
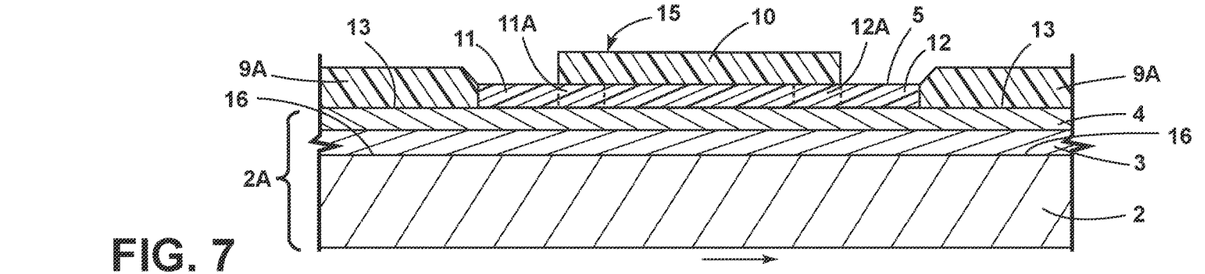
FIG. 7 is a cross-sectional schematic view showing doping of crystallized silicon in source, drain, and gate channel regions and depositing of dielectric insulator material.

Referring again to FIG. 2, at step 27 the amorphous silicon film 5 and the smoothening film 3 and/or diffusion barrier film 4 is patterned into one or more discrete islands 15 whereby the upper surface 16 of ceramic substrate 2 may be exposed (see also FIG. 6). Formation of individual islands 15 alleviates potential warpage and/or stress that might otherwise occur as a result of differences in the coefficients of thermal expansion between ceramic substrate material 2 and semiconductor material 5. Formation of islands 15 also provides electrical isolation of the silicon conductor material 5 of adjacent islands 15. A plurality of islands 15 may (optionally) be formed on an elongated ceramic ribbon substrate 2, whereby the islands 15 form a patterned layer with gaps 17 (elongated grooves) between adjacent islands 15. The gaps or grooves 17 may form a grid and islands 15 may be substantially rectangular in plan view. Although the layers 3 and 4 may be patterned (i.e., removed) between adjacent islands 15, the layers 3 and/or 4 do not necessarily need to be removed in the region of gaps 17, and the layers 3 and/or 4 may form upper surfaces 13 in the regions of gaps 17 between islands 15. As discussed below, the gaps between islands 15 may (optionally) be filled with an electrically insulating material.

Referring again to FIG. 2, at step 28 the silicon material (e.g., amorphous silicon 5) is crystallized by annealing the semiconductor material 5 at an elevated temperature (e.g., at least about 750° C., and preferably greater than about 750° C.). Annealing may be accomplished utilizing a kiln, oven, furnace or other suitable apparatus or process to provide convective heating of substrate 2 and all materials that are deposited on substrate 2 at the time of the annealing process. In general, the annealing (step 28) may be performed after the islands 15 are formed as shown in FIG. 6.

Referring again to FIG. 2, at step 29 the crystallized semiconductor material 5 is then doped to form doped regions 10, 11, 11A, 12, and 12A as shown in FIG. 6. As discussed above, the source and drain regions 11 and 12, respectively, may be highly doped, and the adjacent regions 11A and 12A may be lightly doped. The channel region 10 may also be lightly doped, if required. Doping may be accomplished utilizing vapor-phase epitaxy or other suitable process. It will be understood that various doping amounts/regions may be utilized as required for a particular application.

Referring again to FIG. 2, at step 30 dielectric material 9 and 9A (FIG. 7) is deposited onto the annealed silicon film 5 and surface 13 of layers 3 and/or 4. Alternatively, if the layers 3 and 4 are removed during the formation of islands 15, the dielectric material 9A may be deposited directly onto surface 16 of ceramic substrate 2.

Figure 8:
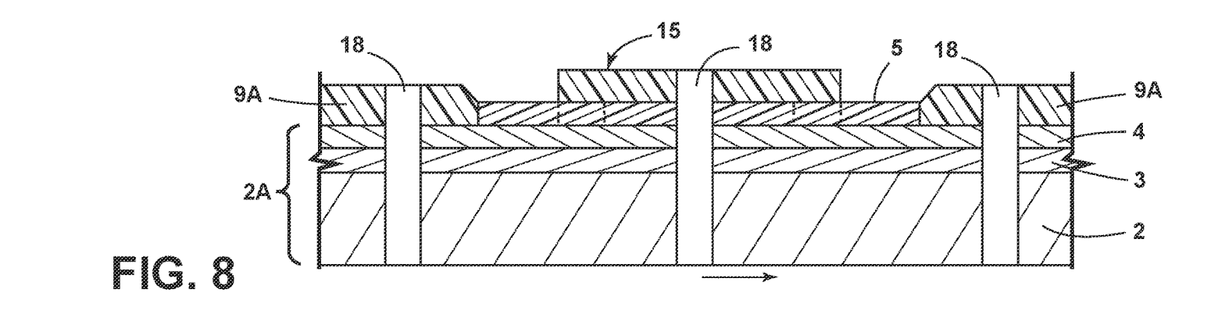
FIG. 8 is a cross-sectional schematic view showing formation of electrically conductive vias in the dielectric insulator material.

Referring again to FIG. 2, at step 31 electrically conductive vias 18 may be formed in (through) the gate insulator dielectric 9, and through the source and drain dielectric 9A (see also FIG. 8). Vias 18 may comprise metal or other electronically conductive material and may extend through substrate 2 to form through substrate vias (TSV·s). Alternatively, as discussed below, an insulating layer 48 (FIG. 10A) may be formed (after the electrodes 6, 7, and 8 are formed) at steps 32, 33, and vias 18A (FIGS. 10A and 11) may be formed to provide electrical connections to the electrodes 6, 7, and 8. Vias 18 (or 18A) may have virtually any suitable configuration, and may be hollow with additional conductive material adjacent the opposite ends thereof (e.g., vias 18A) to provide electrical contact with one or more additional conductive materials 35. It will be understood that various types of suitable vias are known, and the electrically conductive vias 18 or 18A may be positioned and configured as required for a particular application.

Figure 9:
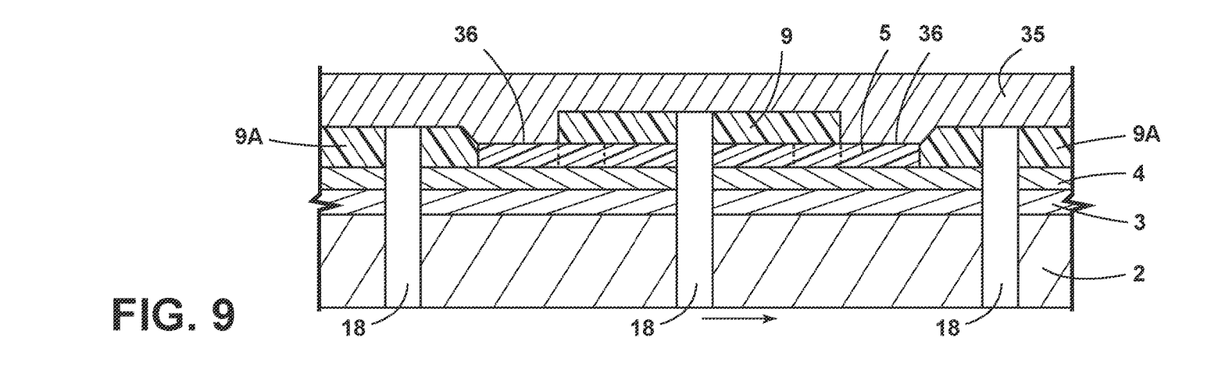
FIG. 9 is a cross-sectional schematic view showing depositing of metal film on the crystallized silicon film and dielectric insulator material.

Referring again to FIG. 2, at step 32 conductive metal film 35 is deposited on the exposed surface areas of silicon film 5 and dielectric materials 9, 9A (see also FIG. 9). The conductive material 35 is checked (if necessary) to ensure Ohmic (or Schottky) contact between the conductive material 35 and the semiconductor film 5 at the interface 36 (FIG. 9) between conductive material 35 and semiconductor material 5. In general, the electrical contact may comprise Ohmic contact. Alternatively, Schottky contact may be formed if required for a particular device. The conductive material 35 may be formed using a physical vapor deposition process or other suitable technique. Conductive material 35 may comprise metal or other electrically conductive material.

Figure 10:
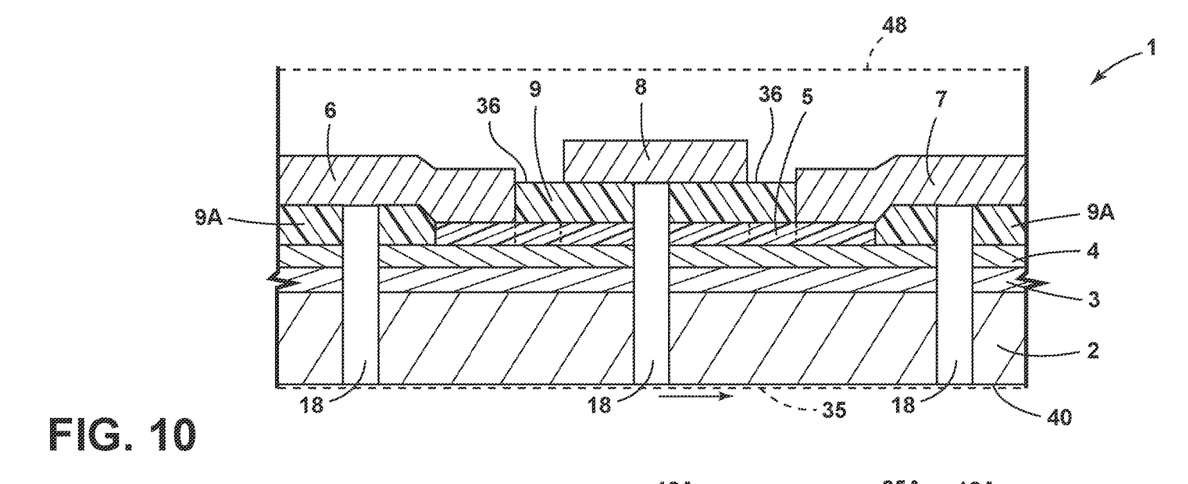
FIG. 10 is a cross-sectional schematic view showing patterning of the source, drain, and gate electrodes.

Referring again to FIG. 2, at step 33 the conductive material 35 is patterned to form source, drain, and gate electrodes 6, 7, and 8, respectively. As shown in FIG. 10, the conductive material 35 may be completely removed around the gate electrode 8 to expose the surface 36 of dielectric gate insulating material 9 to thereby electrically isolate the gate 8 from the source and drain electrodes 6 and 7, respectively. One or more conductors 38 may optionally be disposed adjacent lower surface 40 of ceramic substrate 2 to electrically connect the electrodes 6, 7, and 8 as required in a particular device. The formation of electrodes 6, 7, and 8 may be accomplished utilizing an etching process or other suitable technique to pattern conductive material 35.

Figure 10A:
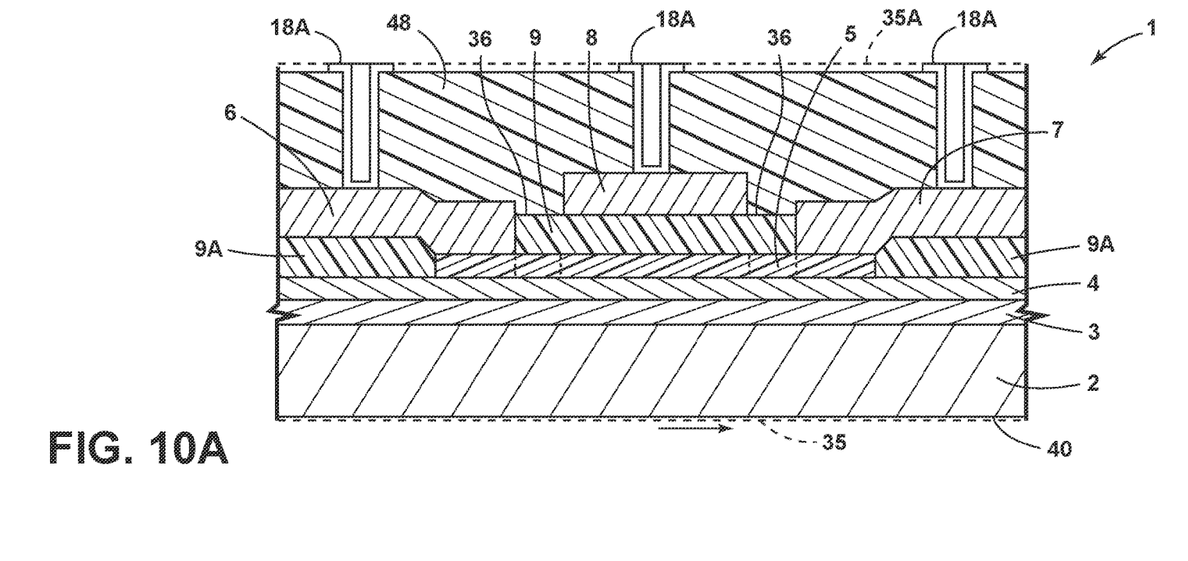
FIG. 10A is a cross-sectional schematic view of a thin film transistor according to another aspect of the present disclosure.

With reference to FIG. 10A, a passivation insulating layer or film 48 may be deposited over the electrodes 6, 7, and 8 and over surface 36 of gate insulator 9, and vias 18A may be formed to thereby electrically interconnect the electrodes 6, 7, and 8 to conductors 35A positioned above layer 48 rather than conductor(s) 35 as shown in FIG. 10. If vias 18A are utilized, step 31 (FIG. 2) is conducted after the electrodes are patterned (step 33), and insulating film 48 is also formed after the electrodes are patterned. Conductors 35 or 35A may be utilized to operably interconnect a large number of devices 1 as required for a flat screen device or other assembly. As shown in FIG. 10A, the TSVs 18 of FIG. 10 are not required if vias 18A are utilized. However, it will be understood that an insulating layer 48 may still be formed on the device of FIG. 10 to protect the upper surface of device 1 from moisture, mechanical damage, etc. Insulating layer 48 may comprise an oxide material (e.g., silicon oxide or silicon nitride) that is deposited in substantially the same manner as insulating material 9, 9A.

Figure 11:
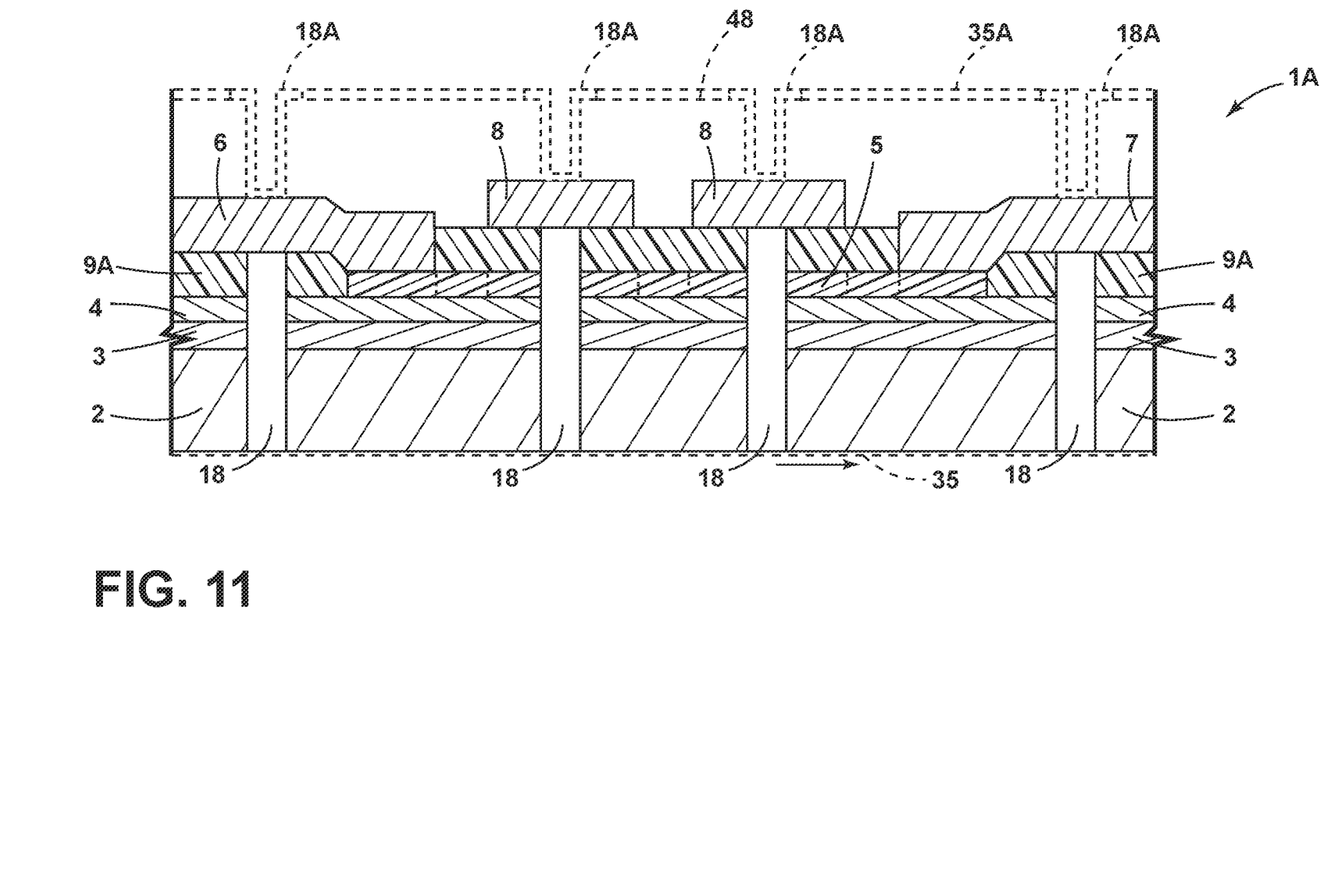
FIG. 11 is a cross-sectional schematic view of a double-gate transistor according to another aspect of the present disclosure.

With further reference to FIG. 11, a dual gate thin film transistor device 1A may be fabricated in a manner that is substantially similar to the process described above in connection with FIGS. 1-10 (and 10A) to form device 1. The dual gate device 1A includes a pair of gates 8 that may be located between the source and drain electrodes 6 and 7, respectively. It will be understood that gates 8 do not necessarily need to be physically positioned between electrodes 6 and 7, but rather may be functionally between electrodes 6 and 7 as discussed below in connection with FIG. 12. Device 1A may include vias 18 as shown in FIG. 10A, and device 1A may also include an insulating layer 48.

Figure 12:
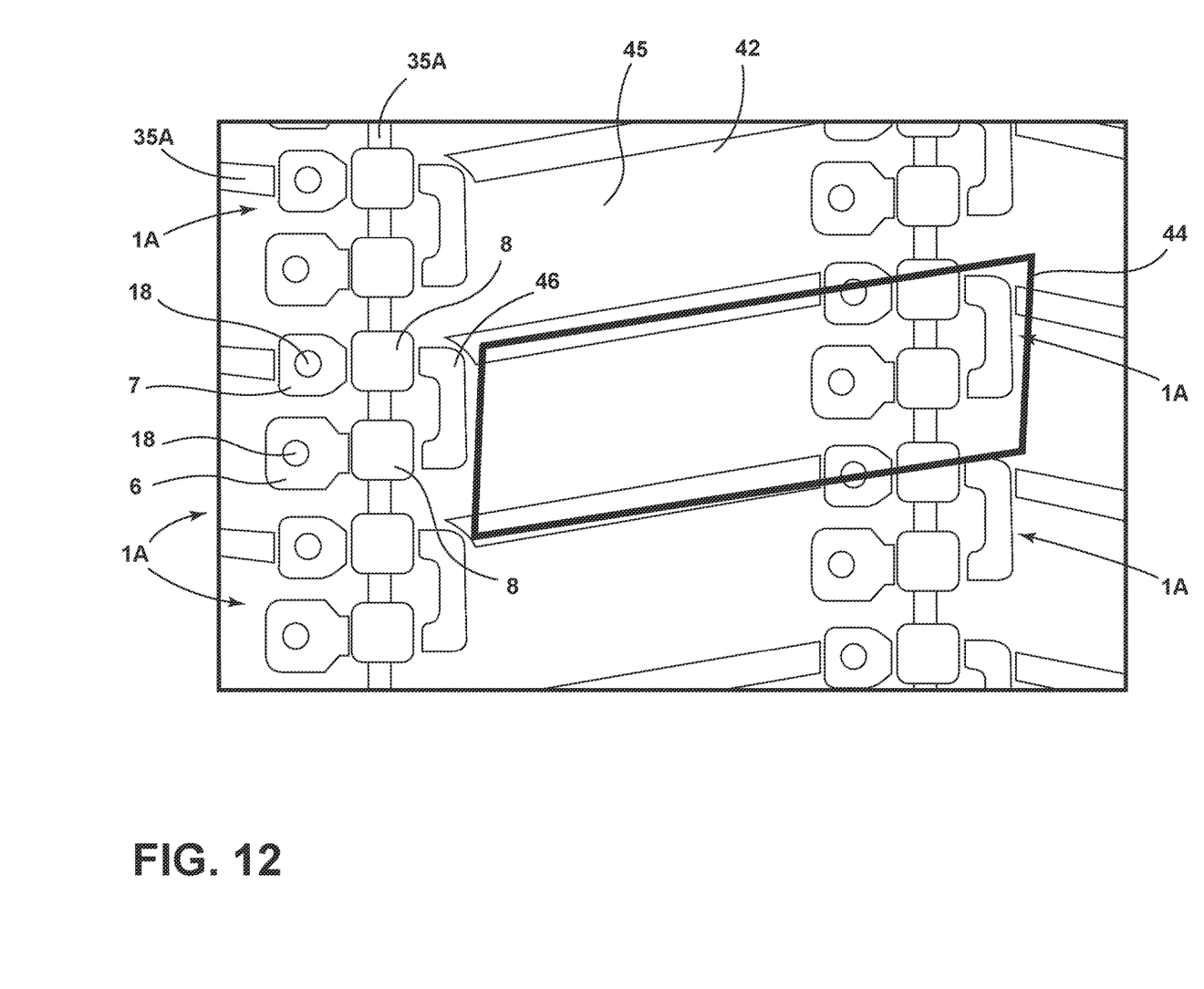
FIG. 12 is a partially fragmentary schematic view of a display panel including a plurality of semiconductor devices according to an aspect of the present disclosure.

With further reference to FIG. 12, a plurality of dual gate transistors 1A may be utilized in an LCD display panel 42 having a plurality of sub-pixels 44. The display panel 42 may comprise an indium tin oxide (ITO) electrode 45 that is operably connected to the double gate devices 1A. Devices 1A may be configured as shown in FIG. 12, and may include source and drain electrodes 6 and 7, and a gate electrode 8 disposed adjacent a highly doped region 46. In the configuration of FIG. 12, the electrodes 6 and 7 are physically positioned (located) to the side of a pair of gate electrodes 8. Nevertheless, the devices 1A of FIG. 12 may have substantially the same functional configuration as shown in FIG. 11, and the gates 8 of FIG. 12 are therefore between electrodes 6 and 7 in terms of the function of the transistors 1A. Conductors 35A (or 35) may form a grid to electrically connect source, drain, and gate electrodes 6, 7, and 8, respectively, as required. The sub-pixel 44 may comprise a fringe field switching pixel wherein the sub-pixel 44 is generally in the shape of a rhombus as shown in FIG. 12. Alternatively, sub-pixel 44 may comprise an OLED including a double gate device 1A, in which case the OLED case is generally rectangular or square. It will be understood that various display panel configurations are known in the art, and the specific configurations of a thin film transistor 1 or 1A according to the present disclosure may vary as required for a particular application.

As shown in FIGS. 3-11, a thin film device 1 according to the present disclosure may be formed in a roll-to-roll process. In general, the steps 24-33 of FIG. 2 may correspond to individual stations at which the materials are deposited, patterned, annealed, and doped as discussed in more detail above in connection with FIGS. 2-10. Because some of the steps 24-33 may require more time (e.g., annealing step 28), an individual ribbon of the ceramic substrate material may be split into a plurality of individual strips for the annealing step 28. In this way, a plurality of strips may be annealed simultaneously (in parallel) to thereby compensate for the increased time required for the annealing step 28 relative to the other steps.

Although the number of rolls 21 and 22 (FIGS. 2 and 3) utilized in the process 20 (FIG. 2) may vary, additional rolls 21 and 22 may be positioned adjacent an oven or kiln to provide for parallel annealing at step 28 (FIG. 2), whereas fewer rolls 21 and 22 may be positioned adjacent the stations corresponding to steps 24-27 and steps 29-33. Also, at least some of the stations may be positioned directly adjacent one another in a line, whereby a ribbon of the substrate may extend through multiple stations, with a single roll upstream of the first station of the line, and a single roll downstream of the last station of the line.

The ribbon ceramic substrate material 2 preferably has suitable thermal capabilities to withstand high temperatures to permit annealing of semiconductor material 5 by heating both the substrate 2 and the semiconductor material 5. Significantly, the ribbon ceramic substrate may withstand temperatures well above 750° C. and may also provide high heat transfer through the substrate due (at least in part) to the reduced thickness of the substrate relative to conventional rigid substrates. This permits annealing of the semiconductor material 5 in a relatively short period of time (e.g., 15, 30, 45, or 60 minutes) utilizing convection heating via gasses (e.g., air, nitrogen, etc.). The material of ribbon ceramic material 2 may also have a very high dielectric constant and it may be very thin and flexible. The high thermal conductivity of the ceramic substrate 2 may be suitable for various electronic applications in which the substrate 2 dissipates heat generated from the transistor. Thin film transistors fabricated on a ribbon ceramic substrate according to an aspect of the present disclosure may be well-suited for RF applications due to the high dielectric properties of the ribbon ceramic substrate at radio frequencies (RF).

Because the substrate 2 can withstand temperatures above 750° C., the annealing process (e.g., step 25, FIG. 2) to form crystalline silicon semiconductor material can be conducted at high substrate temperatures utilizing convection heating in a convection heating apparatus (e.g., an oven, kiln, or furnace), which may provide significant cost savings compared to known excimer laser annealing, flash lamp annealing, or other processes that may be necessary for substrates having lower maximum allowable temperatures.

It will be apparent to those skilled in the art that various modifications and variations can be made without departing from the spirit or scope of the claims.

What is claimed is:

1. A method for making a thin film transistor device, the method comprising:
   forming a semiconductor film on a flexible substrate, wherein the flexible substrate comprises a thin ribbon of refractory material that does not degrade when heated to temperatures greater than at least about 750° C.;
   crystallizing the semiconductor film by simultaneously heating the semiconductor film and the flexible substrate to at least about 750° C. in an apparatus that provides convective heating;
   forming a gate insulator dielectric on the crystallized semiconductor film;
   forming a gate electrode on the gate insulator dielectric;
   forming a source electrode that is in electrical contact with the crystallized semiconductor film;
   forming a drain electrode that is in electrical contact with the crystallized semiconductor film.

2. The method of claim 1, wherein:
   the crystallized semiconductor film comprises silicon having a mobility of at least about 10 cm$^2$/(V·s).

3. The method of claim 1, wherein:
   a plurality of the thin film transistor devices are formed on an elongated continuous substrate that extends through at least one station, wherein the at least one station is selected from the group consisting of a plasma-enhanced chemical vapor deposition station; a heating station comprising at least one of a kiln, oven, or furnace; a station for forming the gate insulator dielectric on the crystallized semiconductor film; and a station that forms at least one of the gate electrode, the source electrode, and the drain electrode.

4. The method of claim 2, wherein:
   the refractory material is selected from the group consisting of flexible alumina ceramic and flexible yttrium-stabilized zirconia.

5. The method of claim 1, wherein:
   the flexible substrate has a thickness of 5 μm-100 μm.

6. The method of claim 5, wherein:
   the flexible substrate has a thickness of about 20 μm.

7. The method of claim 5, wherein:
   the flexible substrate has a width of 200 mm-400 mm when the semiconductor film is formed on the flexible substrate.

8. The method of claim 1, including:
   forming through substrate vias that extend through the flexible substrate, or vias that extend through a passivating insulating layer, wherein the passivating insulating layer extends over at least one of the gate electrode, the source electrode, and the drain electrode.

9. The method of claim 1, wherein:
   at least one of the source electrode and the gate electrode are in Schottky or Ohmic contact with the crystallized semiconductor film.

10. The method of claim 1, including:
doping the crystallized semiconductor material to form source, drain, and channel regions;
forming the source, drain, and channel electrodes adjacent the source, drain, and channel regions, respectively.

11. The method of claim 10, including:
forming a pair of gate electrodes adjacent to the channel region.

12. The method of claim 1, wherein:
the semiconductor film comprises a material selected from the group consisting of Ge, SiGe, CdTe, CIGS, Epitaxial GaAs, GaN, and silicon.

13. The method of claim 1, including:
patterning the semiconductor film to form a plurality of electrically isolated islands of semiconductor film disposed on the flexible substrate, whereby a plurality of thin film transistor devices can be formed on a single piece of the flexible substrate.

14. The method of claim 1, including:
depositing a first layer of material on the flexible substrate before forming the semiconductor film on the substrate, wherein the first layer comprises a material selected from the group consisting of smoothening materials and barrier materials.

15. The method of claim 1, wherein:
the crystallized semiconductor film comprises silicon having a mobility of at least about 10 $cm^2/(V \cdot s)$.

16. A method for making a display panel comprising a plurality of thin film transistor devices, the method comprising:
forming a semiconductor film on a flexible substrate, wherein the flexible substrate comprises a thin ribbon of refractory material;
patterning the semiconductor film to form a plurality of electrically isolated discrete islands of the semiconductor film disposed on the flexible substrate;
crystallizing the semiconductor film by convectively heating the semiconductor film and the flexible substrate;
doping the semiconductor film after crystallizing the semiconductor film;
forming a gate insulator dielectric on the crystallized semiconductor film of each electrically isolated discrete island;
forming a gate electrode on the gate insulator dielectric of each electrically isolated discrete island;
forming a source electrode that is electrically connected to the crystallized semiconductor film of each electrically isolated discrete island;
forming a drain electrode that is electrically connected to the crystallized semiconductor film of each electrically isolated discrete island;
operably interconnecting the thin film transistor devices to form a plurality of sub-pixels.

17. The method of claim 16, wherein:
the crystallized semiconductor film has a mobility of at least about 10 $cm^2/(V \cdot s)$.

18. The method of claim 16, wherein:
a plurality of the thin film transistor devices are formed on an elongated continuous substrate that extends through at least one station, wherein the at least one station is selected from the group consisting of a plasma-enhanced chemical vapor deposition station, a convective heating station, a station for forming the gate insulator dielectric on the crystallized semiconductor film, and a station that forms at least one of the gate electrode, the source electrode, and the drain electrode.

19. A method for making a thin film transistor device, the method comprising:
forming a semiconductor film on a flexible substrate, wherein the flexible substrate comprises a thin ribbon of refractory material having a first surface roughness;
depositing a smoothening film onto the flexible substrate, wherein a surface roughness of the smoothening film is less than the first surface roughness;
crystallizing the semiconductor film by convectively heating the semiconductor film and the flexible substrate;
forming a gate insulator dielectric on the crystallized semiconductor film;
forming a gate electrode on the gate insulator dielectric;
forming a source electrode that is electrically connected to the crystallized semiconductor film;
forming a drain electrode that is electrically connected to the crystallized semiconductor film.

20. The method of claim 19, wherein:
the first surface roughness is at least 20 nm, and the surface roughness of the smoothening film is less than 50 nm.

* * * * *